(12) United States Patent
Leng

(10) Patent No.: US 11,824,080 B2
(45) Date of Patent: Nov. 21, 2023

(54) THIN-FILM RESISTOR (TFR) WITH DISPLACEMENT-PLATED TFR HEADS

(71) Applicant: Microchip Technology Incorporated, Chandler, AZ (US)

(72) Inventor: Yaojian Leng, Portland, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 153 days.

(21) Appl. No.: 17/233,342

(22) Filed: Apr. 16, 2021

(65) Prior Publication Data

US 2022/0157927 A1     May 19, 2022

Related U.S. Application Data

(60) Provisional application No. 63/116,044, filed on Nov. 19, 2020.

(51) Int. Cl.
*H01L 23/532*     (2006.01)
*H01C 17/075*     (2006.01)
(Continued)

(52) U.S. Cl.
CPC ............ *H01L 28/24* (2013.01); *H01C 7/006* (2013.01); *H01C 17/075* (2013.01);
(Continued)

(58) Field of Classification Search
CPC .............. H01L 28/24; H01L 23/53238; H01L 21/76832; H01L 21/76834; H01L 21/76849; H01L 23/5226; H01L 23/5228; H01L 23/53295; H01L 21/76805; H01L 24/03; H01L 24/05; H01C 7/006; H01C 17/075
See application file for complete search history.

(56) References Cited

U.S. PATENT DOCUMENTS 8,747,960 B2   6/2014   Dordi et al. .................. 427/534
9,679,844 B2   6/2017   Leng et al.
(Continued)

OTHER PUBLICATIONS

International Search Report and Written Opinion, Application No. PCT/US2021/033073, 14 pages, dated Aug. 25, 2021.

*Primary Examiner* — Patricia D Valenzuela
(74) *Attorney, Agent, or Firm* — SLAYDEN GRUBERT BEARD PLLC

(57) ABSTRACT

A thin film resistor (TFR) module may be formed in copper interconnect in an integrated circuit device. A pair of displacement-plated TFR heads may be formed by forming a pair of copper TFR head elements (e.g., damascene trench elements) spaced apart from each other in a dielectric region, and displacement plating a barrier region on each TFR head element to form a displacement-plated TFR head. A TFR element may be formed on the pair of displacement-plated TFR heads to define a conductive path between the pair of TFR head elements through the TFR element and through the displacement-plated barrier region on each metal TFR head. Conductive contacts may be formed connected to the pair of displacement-plated TFR heads. The displacement-plated barrier regions may protect the copper TFR heads from copper corrosion and/or diffusion, and may comprise CoWP, CoWB, Pd, CoP, Ni, Co, Ni—Co alloy, or other suitable material.

15 Claims, 10 Drawing Sheets

(51) Int. Cl.
*H01L 49/02* (2006.01)
*H01C 7/00* (2006.01)
*H01L 23/00* (2006.01)

(52) U.S. Cl.
CPC ........ *H01L 23/53238* (2013.01); *H01L 24/03* (2013.01); *H01L 24/05* (2013.01)

(56) References Cited

U.S. PATENT DOCUMENTS

| | | | |
|---|---|---|---|
| 2005/0001325 A1 | 1/2005 | Andricacos et al. | 257/762 |
| 2006/0160299 A1* | 7/2006 | Rao | H01L 21/76834 |
| | | | 257/E21.174 |
| 2012/0193755 A1* | 8/2012 | Dundulachi | H01L 24/05 |
| | | | 438/653 |
| 2014/0184381 A1 | 7/2014 | Hao et al. | 338/306 |
| 2019/0019858 A1* | 1/2019 | Ali | H01L 28/24 |
| 2019/0139861 A1* | 5/2019 | Kande | H01L 23/42 |
| 2019/0305074 A1* | 10/2019 | Kande | H01L 21/0332 |

* cited by examiner

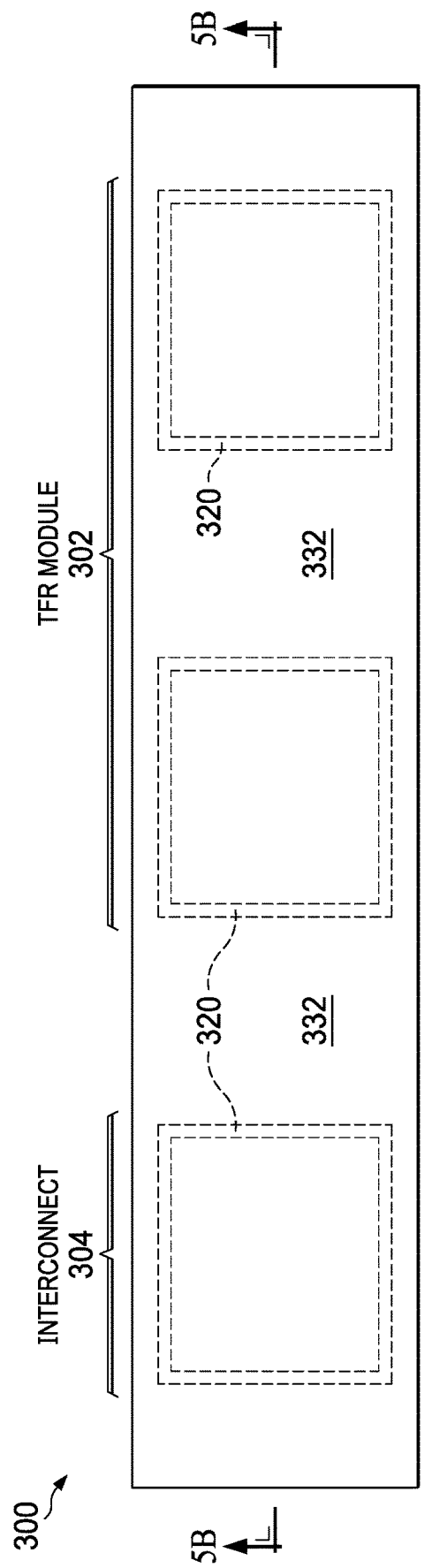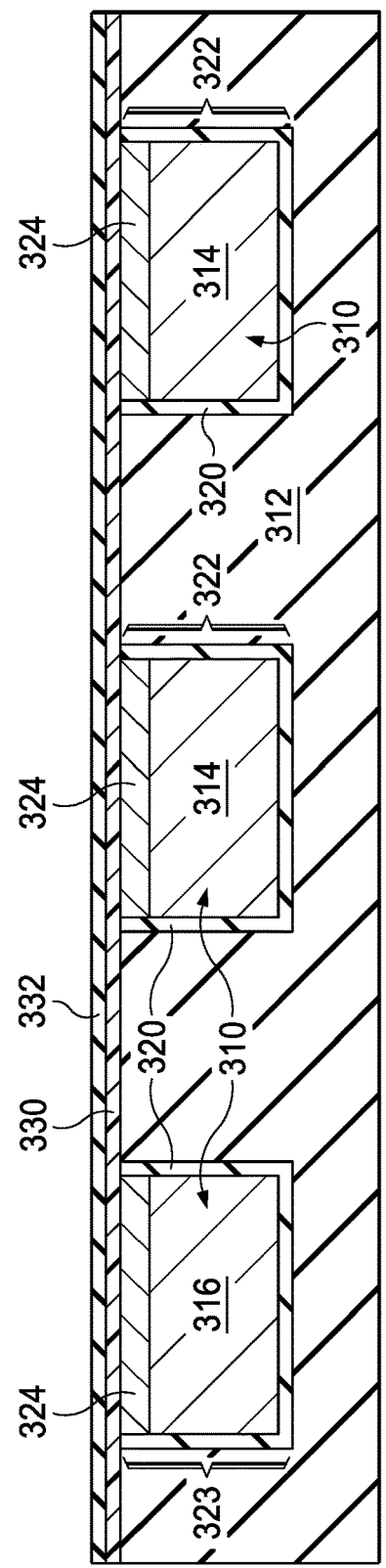
FIG. 5A
FIG. 5B

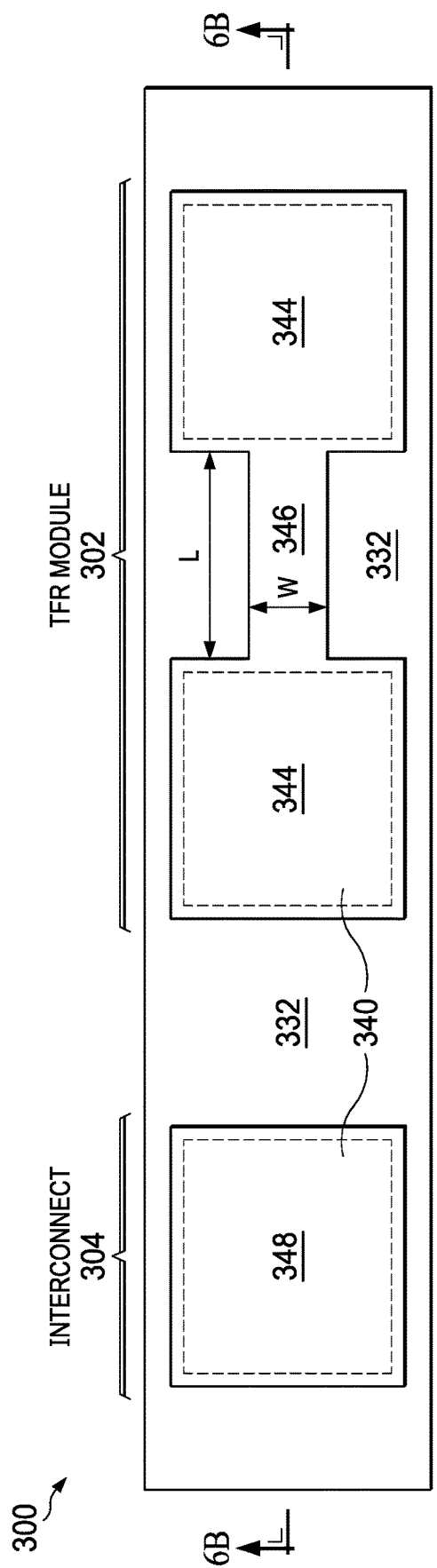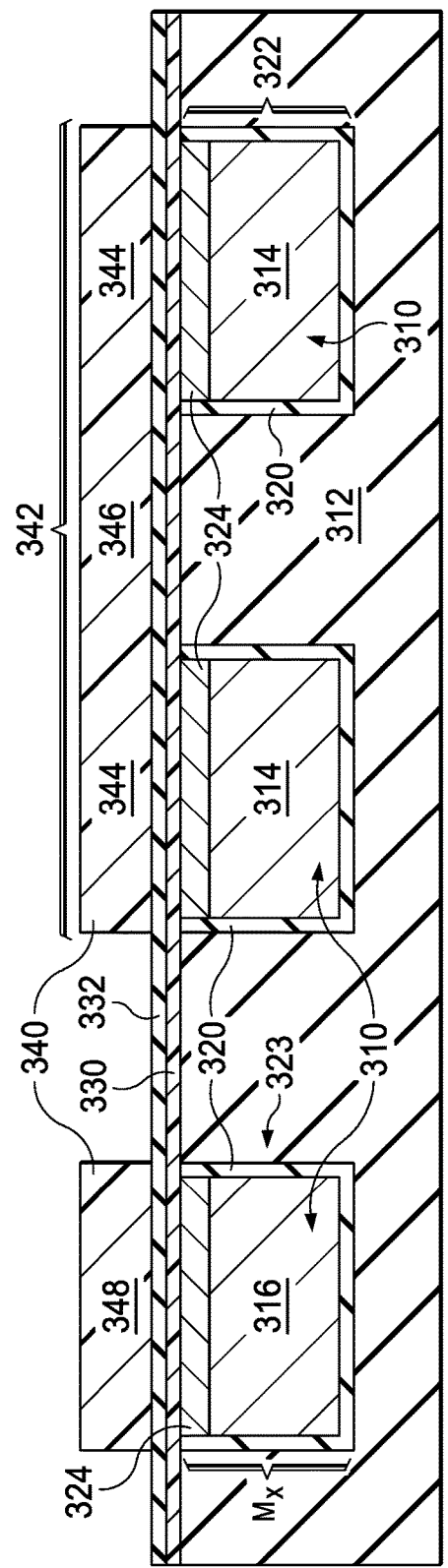
FIG. 6A
FIG. 6B

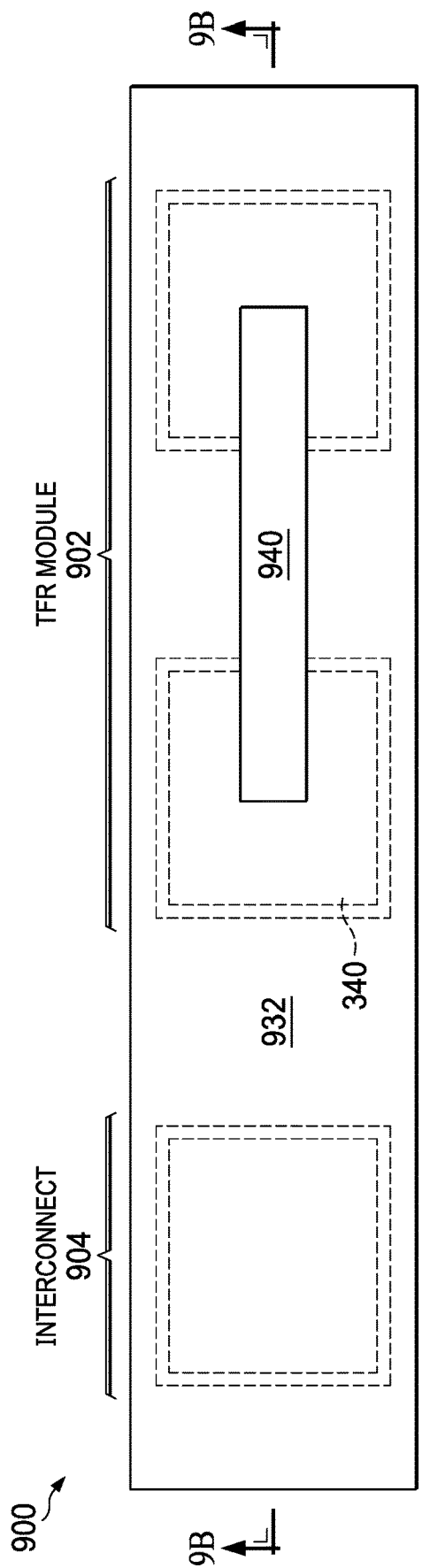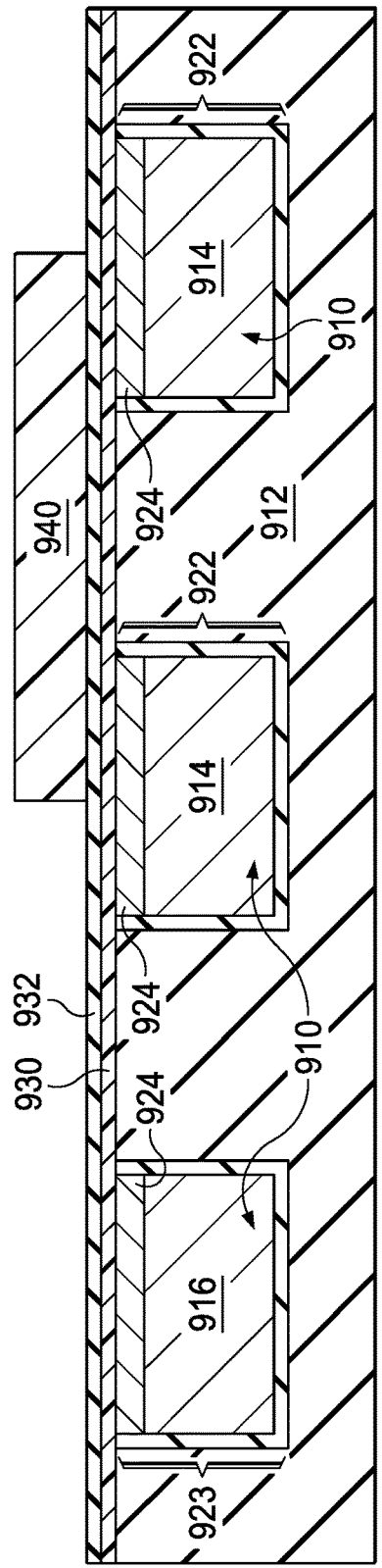
FIG. 9A
FIG. 9B

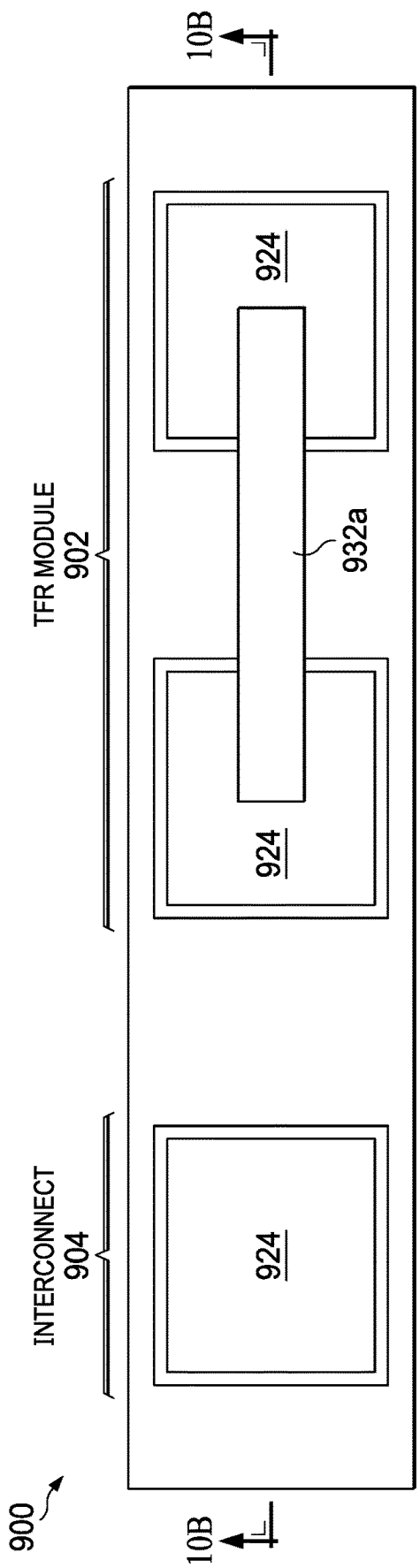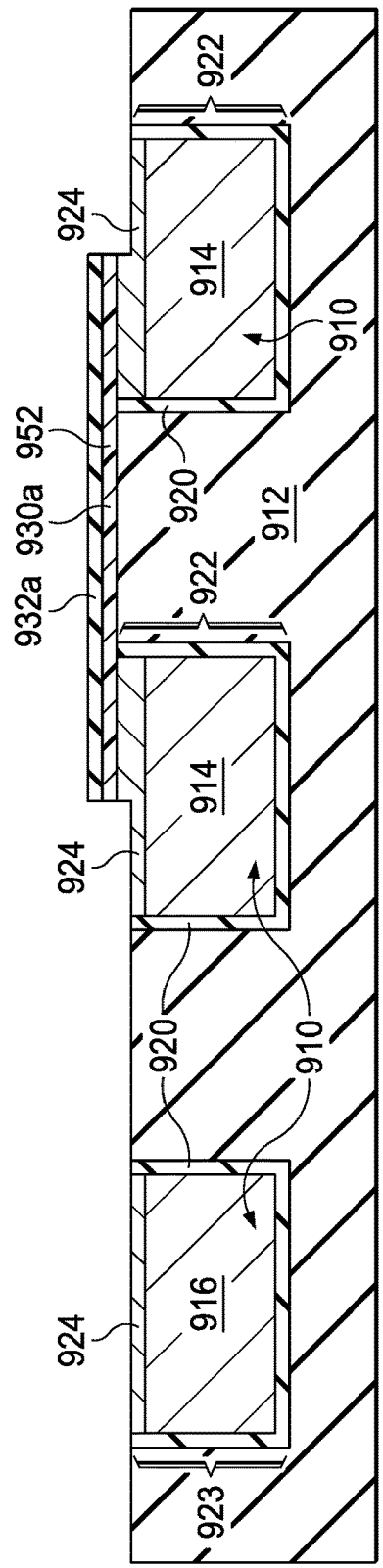
FIG. 10A
FIG. 10B

THIN-FILM RESISTOR (TFR) WITH DISPLACEMENT-PLATED TFR HEADS

RELATED APPLICATION

This application claims priority to commonly owned U.S. Provisional Patent Application No. 63/116,044 filed Nov. 19, 2020, the entire contents of which are hereby incorporated by reference for all purposes.

TECHNICAL FIELD

The present disclosure relates to thin-film resistors (TFRs) formed in integrated circuit (IC) devices, for example TFR modules including displacement-plated TFR heads formed in copper interconnect, and methods for manufacturing such TFR modules.

BACKGROUND

Semiconductor-based integrated circuit (IC) devices typically include patterned metal layers, referred to as interconnects, to connect various components of the IC devices, e.g., back end of line (BEOL) circuitry elements. Copper and aluminum are common interconnect materials. Copper is often preferred due to its lower resistivity and high electromigration resistance. However, copper interconnect is typically difficult to manufacture with traditional photoresist masking and plasma etching techniques.

One known technique for forming copper interconnects in an IC device is known as additive patterning, sometimes called a damascene process, which refers to traditional metal inlaying techniques. A damascene process may include patterning a dielectric region, e.g., including silicon dioxide, fluorosilicate glass (FSG), or organo-silicate glass (OSG), to form open trenches where the copper (or other metal) is intended to be formed. A copper diffusion barrier layer (typically Ta, TaN, or a bi-layer of both) is deposited, followed by deposition of a copper seed layer, followed by a bulk copper fill, e.g., using an electro-chemical plating process. A chemical-mechanical planarization (CMP) process may then be used to remove any excessive copper and barrier layer material, and may thus be referred to as a copper CMP. The copper remaining in each trench functions as a conductor. A dielectric barrier layer, e.g., silicon nitride (SiN) or silicon carbide (SiC), is then typically deposited over the wafer to prevent copper diffusion (e.g., into neighboring silicon), thereby improving device reliability.

With more features being packed into individual semiconductor chips, there is an increased need to fit large numbers of passive components, such as resistors, into the circuits. Some resistors can be created through ion implantation and diffusion, such as poly resistors. However, such resistors typically have high variations in resistance value, and may also have resistance values that change drastically as a function of temperature. A developing technique for constructing integrated resistors, called Thin-Film Resistors (TFRs), typically improves integrated resistor performance. TFRs are often formed from SiCr (silicon-chromium), SiCCr (silicon-silicon carbide-chromium), TaN (tantalum nitride), NiCr (nickel-chromium), AlNiCr (aluminum-doped nickel-chromium), or TiNiCr (titanium-nickel-chromium), for example.

FIG. 1 shows a cross-sectional view of two example TFRs 10A and 10B implemented using conventional techniques. The fabrication of a conventional TFR 10A or 10B typically requires three added mask layers, with reference to a background fabrication process for the relevant IC device. In particular, a first added mask layer may be used to create TFR heads 12A and 12B, a second added mask layer may be used to create a TFR element 14, and a third added mask layer may be used to create TFR vias 16A and 16B. As shown, the TFR element 14 of TFR 10A is formed across the top of the TFR heads 12A and 12B, while the TFR element 14 of TFR 10B is formed across the bottom of the TFR heads 12A and 12B, but each design typically uses three added mask layers.

Some implementations of TFRs 10A and 10B are formed in copper interconnect, for example by forming TFR heads 12A and 12B as Cu damascene structures. However, using copper interconnect for TFR modules has been particularly challenging. For example, copper TFR heads 12A and 12B are typically susceptible to copper corrosion during TFR manufacturing and copper diffusion during and/or after TFR manufacturing, which may form deep-level traps and substantially degrade transistor performance in the relevant device. A dielectric barrier layer, such as silicon nitride, or silicon carbide, is often used to seal exposed copper interconnect surfaces, e.g., after a copper CMP, but such barrier layer prevents direct electric connection to the copper, and is thus not suitable for protecting copper TFR heads.

There is a need for improved TFRs for integrated circuits, and methods of construction. For example, there is a need for TFR modules integrated in copper interconnect that avoid or reduce the copper corrosion and/or copper diffusion associated with conventional designs, to thereby improve device performance. Further, there is a need or advantage (e.g., cost and time advantage) to reduce the number of mask layers needed to construct integrated TFRs e.g., as compared with conventional TFRs 10A and 10B discussed above. There is also a need in some applications for such TFR module that provide a sheet resistance $R_s$ of about 1 k$\Omega$/square (for example, and a temperature coefficient of resistance (TCR) close to 0, for example in the range of −100 ppm/° C. to +100 ppm/° C., which may enable new integrated circuit designs, particularly designs including analog components in copper interconnect structures.

SUMMARY

Embodiments of the present disclosure provide TFRs that may be integrated in IC devices in a modular manner, thus referred to herein as "TFR modules." For example, some embodiments provide TFR modules formed in damascene interconnect structures of IC devices, and methods for manufacturing such TFR modules. The TFR modules can be formed at any level of interconnect (e.g., at any metal layer) in the IC device structure.

In some embodiments a TFR module incudes a TFR element formed on a pair of displacement-plated TFR heads. The displacement-plated TFR heads may be formed by displacement plating a barrier region on each of a pair of Cu TFR head elements. The TFR element formed on the pair of displacement-plated TFR heads provides a conductive path between the pair of Cu TFR head elements through the TFR element and through the displacement-plated barrier regions. The displacement-plated barrier regions may both (a) provide a reliable conductive contact between the TFR element and Cu TFR heads and (b) protect upper surfaces of the Cu TFR head elements from corrosion and copper diffusion during and after the manufacture of the TFR module. In some embodiments the displacement-plated barrier region may comprise cobalt tungsten phosphide (CoWP), which may be particular suitable for the features discussed above. In other embodiments the displacement-plated barrier region may comprise Pd, CoP, CoWB, Ni, Co, Ni—Co alloy, or any other suitable material.

Statements and references herein regarding a displacement-plated barrier region providing protection against copper corrosion and diffusion mean the displacement-plated barrier region provides at least a partial barrier against copper corrosion and diffusion. For example, the disclosed displacement-plated barrier regions may provide functional reliability for the relevant device (e.g., TFR module or device including the TFR module) over a 10 year period at normal device operating temperatures (−40° C. to 125° C.).

In some embodiments a TFR module including displacement-plated TFR heads as disclosed herein may provide a sheet resistance of about 1 kΩ/square, or in the range of 100 Ω/square to 10 kΩ/square, and a temperature coefficient of resistance (TCR) close to 0, for example in the range of −100 ppm/° C. to +100 ppm/° C.

One aspect provides a method of manufacturing a thin film resistor (TFR) module in an integrated circuit (IC) structure. A pair of displacement-plated TFR heads may be formed by forming a pair of TFR head elements spaced apart from each other in a dielectric region, and displacement plating a barrier region on each TFR head element. A TFR element may be formed on the pair of displacement-plated TFR heads to define a conductive path connecting the pair of TFR head elements through the TFR element and through the displacement-plated barrier region on each metal TFR head. Conductive contacts may be formed to conductively contact the displacement-plated TFR heads.

In one embodiment, the TFR element comprises SiCr or SiCCr.

In one embodiment, the TFR head elements are formed using a damascene process. For example, the TFR head elements may comprise Cu damascene structures.

In one embodiment, the displacement-plated barrier region formed on each TFR head element comprises cobalt tungsten phosphide (CoWP).

In one embodiment, the TFR element fully covers a top area of each displacement-plated TFR head.

In one embodiment, the TFR film includes (a) a pair of head regions, each covering a top area of one of the displacement-plated TFR heads and (b) a connecting region connecting the pair of head regions, the connecting region having a smaller width than the head regions.

Another aspect provides an IC structure including a TFR module including a pair of spaced-apart displacement-plated TFR heads, a TFR element formed on the pair of spaced-apart displacement-plated TFR heads, and conductive contacts connected to the displacement-plated TFR heads. Each displacement-plated TFR head includes a displacement-plated barrier region formed on a respective TFR head element. The TFR element formed on the pair of spaced-apart displacement-plated TFR heads defines a conductive path connecting the pair of TFR head elements through the TFR element and through the displacement-plated barrier region at the top of each metal TFR head.

In one embodiment, the TFR element comprises SiCr or SiCCr.

In one embodiment, the TFR head elements are formed using a damascene process. For example, the TFR head elements may comprise Cu damascene structures.

In one embodiment, the displacement-plated barrier region formed on each TFR head element comprises cobalt tungsten phosphide (CoWP).

In one embodiment, the TFR element fully covers a top area of each displacement-plated TFR head.

In one embodiment, the TFR film includes (a) a pair of head regions, each covering a top area of one of the displacement-plated TFR heads and (b) a connecting region connecting the pair of head regions, the connecting region having a smaller width than the head regions.

Another aspect provides an IC structure including a TFR module and a first interconnect structure. The TFR module may include (a) a pair of spaced-apart displacement-plated TFR heads, each including a TFR head element formed in a first metal layer and a displacement-plated barrier region formed on the TFR head element, and (b) a TFR element formed on the spaced-apart displacement-plated TFR heads to define a conductive path connecting the pair of TFR head elements through the TFR element and through the displacement-plated barrier region at the top of each metal TFR head. The first interconnect structure may include an interconnect trench element formed in the first metal layer, and a displacement-plated barrier region formed on the interconnect trench element.

In one embodiment, the IC structure also includes a TFR film region formed on the displacement-plated barrier region formed on the interconnect trench element and spaced apart from the TFR element, wherein the TFR film region and the TFR element are formed from a common TFR film.

In one embodiment, the TFR element comprises SiCr or SiCCr.

In one embodiment, the pair of TFR head elements and the interconnect trench element comprise copper damascene structures.

In one embodiment, the displacement-plated barrier region formed on each TFR head element and the displacement-plated barrier region formed on the interconnect trench element each comprise cobalt tungsten phosphide (CoWP).

In one embodiment, the IC structure includes a second metal layer including (a) a respective TFR contact connected to each displacement-plated TFR head by a respective TFR contact via, and (b) a second interconnect trench element connected to the first interconnect structure by an interconnect via.

BRIEF DESCRIPTION OF THE DRAWINGS

Example aspects of the present disclosure are described below in conjunction with the figures, in which:

FIGS. 3A-8 show an example process for forming an example TFR module and nearby interconnect structure in an integrated circuit, according to one example embodiment; and FIGS. 9A-10B show an alternative embodiment for forming an example TFR module and nearby interconnect structure, wherein the photomask used to form the TFR element covers only a selected area over the TFR heads, according to one example embodiment.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present disclosure provide TFR modules including a TFR element formed on a pair of displacement-plated TFR heads. Each displacement-plated TFR head may include a displacement-plated barrier region formed on a copper TFR head element, e.g., a Cu damascene trench structure formed in a Cu interconnect layer. The TFR element formed on the displacement-plated TFR heads provides a conductive path connecting the pair of Cu TFR head elements through the TFR element and through the displacement-plated barrier regions. The displacement-plated barrier regions may both (a) provide a reliable conductive contact between the TFR element and Cu TFR heads and (b) protect upper surfaces of the Cu TFR head elements during the manufacture of the TFR module. In some embodiments the displacement-plating may comprise CoWP, CoWB, Pd, CoP, Ni, Co, Ni—Co alloy, or any other suitable material. Although the present disclosure focuses on embodiments formed in Cu interconnect, in other embodiments the TFR module may be formed in damascene interconnect of other metals, for example iridium (Ir), rhodium (Rh), ruthenium (Ru), or cobalt (Co).

Figure 1:
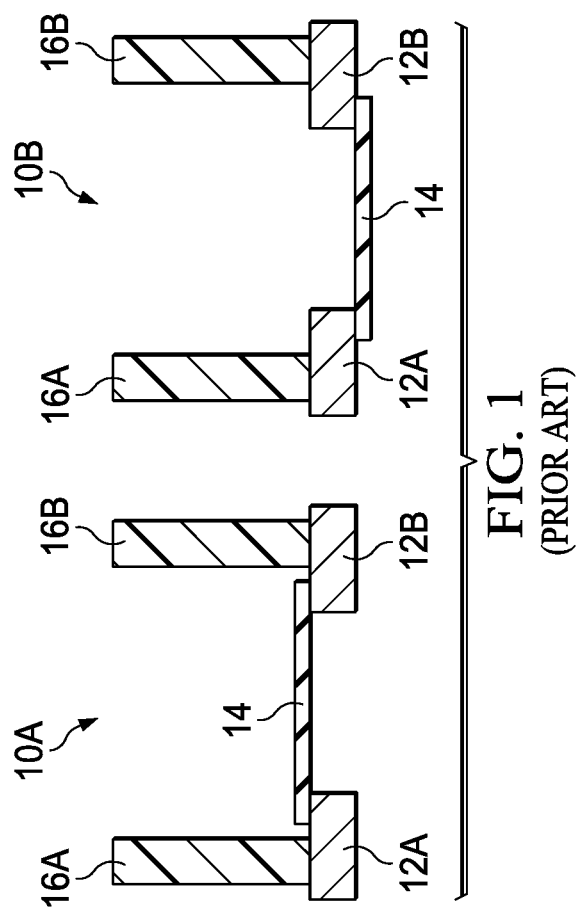
FIG. 1 shows a cross-sectional view of two example TFRs implemented using conventional techniques.
Figure 2:
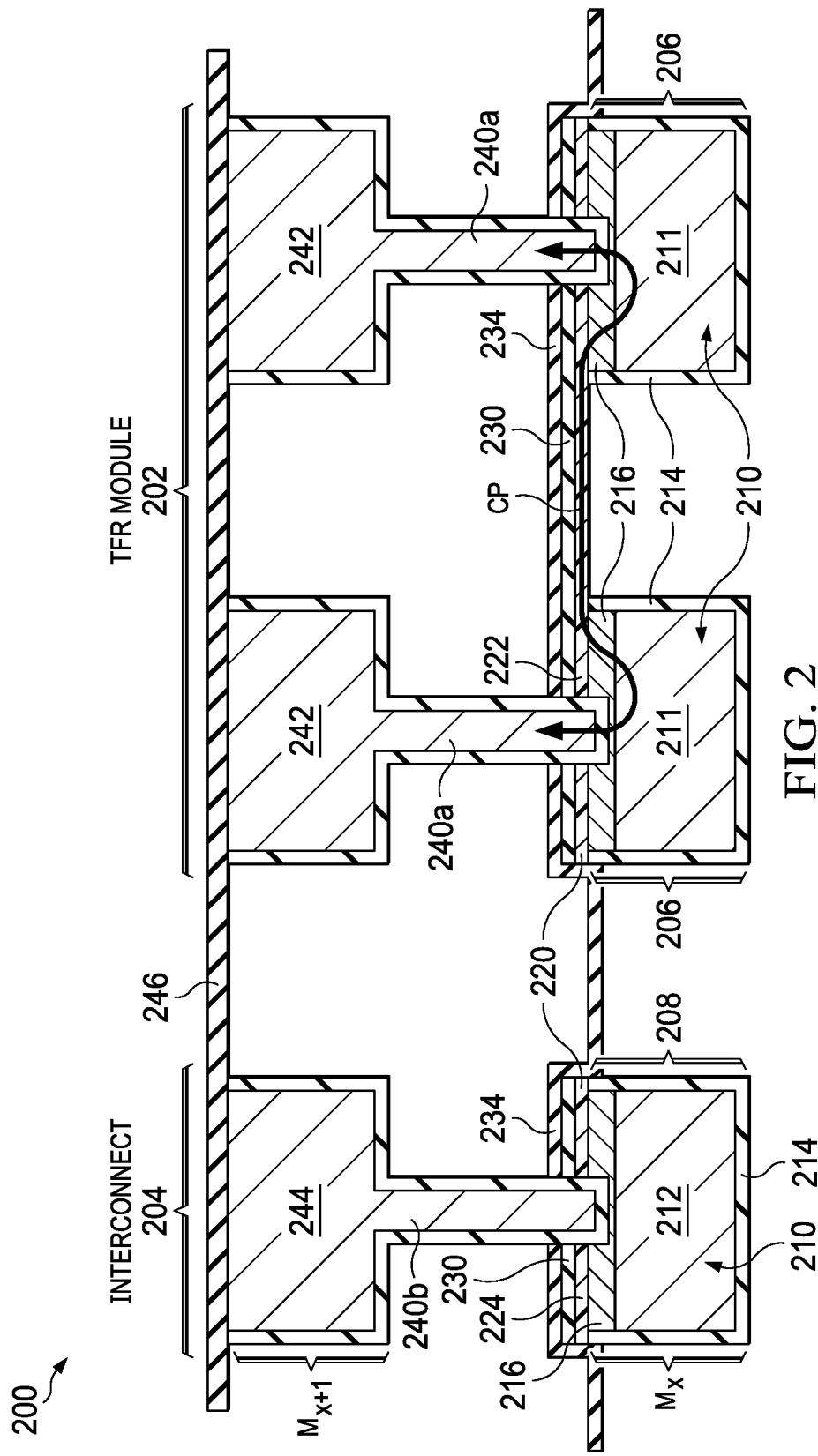
FIG. 2 illustrates an example integrated circuit structure including a TFR module along with a nearby interconnect structure, formed according to an example embodiment of the present disclosure.

FIG. 2 illustrates an example IC structure 200 including a TFR module 202 along with a nearby interconnect structure 204, formed according to an embodiment of the present disclosure. As shown, the TFR module 202 includes a TFR element 222 connecting a pair of TFR heads 206 with each other. Each TFR head 206 is contacted by a respective TFR contact via 240a and TFR contact 242. The interconnect structure 204 includes a lower interconnect structure 208 and upper interconnect structure 244 connected by an interconnect via 240b. TFR heads 206 and lower interconnect structure 208 are formed in one metal interconnect layer $M_x$, wherein the subscript "x" refers the level of interconnect metal in the IC structure, for example x=2 refers to a metal-2 layer; and TFR contacts 242 and upper interconnect structure 208 are formed in the next formed metal interconnect layer $M_{x+1}$.

Each TFR head 206 and lower interconnect structure 208 may comprise a Cu trench element 210 having a displacement-plated barrier region 216 formed at the top of the Cu trench element 210 by a displacement plating process on an exposed top surface of each Cu trench element 210. In particular, each TFR head 206 may comprise a Cu TFR head element 211 having a displacement-plated barrier region 216 formed thereon, and lower interconnect structure 208 may comprise a Cu interconnect element 212 having a displacement-plated barrier region 216 formed thereon. Thus, TFR heads 206 and lower interconnect structure 208 may be referred to as "displacement-plated TFR heads 206" and "displacement-plated lower interconnect structure 208." As discussed below, the displacement-plated barrier regions 216 may protect each Cu trench element 210 from corrosion during manufacturing of the IC structure 200.

In some embodiments, each Cu trench element 210 may comprise a Cu damascene trench element formed over a barrier layer 214 (e.g., a Ta/TaN bilayer) deposited in a respective trench. The displacement-plated barrier regions 216 formed over each Cu trench element 210 (including Cu TFR head elements 211 and Cu interconnect element 212) may comprise metal, to thereby define a conductive path between the TFR element 222 and Cu TFR head elements 211, as indicated by the double-headed arrow CP in FIG. 2. In some embodiments, the displacement-plated barrier regions 216 may be formed with a thickness in the range of 100 Å-300 Å, for example about 200 Å.

In addition, the displacement-plated barrier regions 216 may protect a top surface of each Cu trench element 210 during subsequent construction of the TFR module 202 and interconnect structure 204, e.g., to prevent or reduce copper corrosion, which may be important for the resulting reliability of the TFR module 202 and interconnect structure 204. Thus, the displacement-plated barrier regions 216 may be formed from material(s) suitable for both (a) providing an effective electrical contact between the TFR element 222 and Cu TFR head elements 211 and (b) protecting Cu trench elements 210 (including Cu TFR head elements 211 and Cu interconnect element 212) from corrosion or other degradation, e.g., during construction of the TFR module 202 and interconnect structure 204. In some embodiments, the displacement-plated barrier regions 216 may comprise CoWP, found to be particularly suitable for the properties discussed above. In other embodiments, the displacement-plated barrier regions 216 may comprise CoWB, Pd, CoP, Ni, Co, Ni—Co alloy, or any other suitable material.

As discussed in more detail below, the TFR element 222 may be formed by (a) depositing a TFR film 220, e.g., comprising SiCCR or SiCr, over the displacement-plated TFR heads 206 and displacement-plated lower interconnect structure 208, and (b) patterning the TFR film 220 to define (i) the TFR element 222 bridging the displacement-plated TFR heads 206 and (ii) a TFR film region 224 over the displacement-plated lower interconnect structure 208. A TFR cap 230 (e.g., comprising a silicon nitride or silicon oxide) may be formed over the TFR film 220, and an optional dielectric barrier layer 234 may be formed over the TFR cap. The dielectric barrier layer 234 may be optional, e.g., depending on the suitability of underlying layers (including the displacement-plated barrier regions 216) to act as a copper diffusion barrier. For example, the optional dielectric barrier layer 234 may be omitted where the displacement plated layer 216 itself provides an effective copper diffusion barrier for the underlying Cu damascene trench element 210. For example, in some embodiments TFR cap 230 is formed from SiN and provides an additional copper diffusion barrier, such that the dielectric barrier layer 234 may be omitted.

Each displacement-plated TFR head 206 and displacement-plated lower interconnect structure 208 may be contacted by circuitry in other metal layer(s). For example, as mentioned above, each displacement-plated TFR head 206 may be connected to a TFR contact 242 formed in a metal layer $M_{x+1}$ by a respective TFR contact via 240a, and the displacement-plated lower interconnect structure 208 may be connected to an upper interconnect structure 244 formed in a metal layer $M_{x+1}$ by a respective interconnect via 240b. In the illustrated embodiment, metal layer $M_{x+1}$ structures 242, 244 and vias 240a, 240b are formed as Cu dual damascene structures. A dielectric barrier layer 246 may be formed over metal layer $M_{x+1}$.

In some embodiments, TFR element 222 may comprise SiCCR, SiCr, or NiCr with a thickness in the range of 50 Å-1000 Å, which may provide a sheet resistance $R_s$ in the range of 100 Ω/square to 10 kΩ/square, or about 1 kΩ/square, and a temperature coefficient of resistance (TCR) close to 0, for example in the range of −100 ppm/° C. to +100 ppm/° C.

Although metal layers $M_x$ and $M_{x+1}$ may comprise copper as discussed above, in other embodiments metal layer $M_x$ and/or $M_{x+1}$ (and thus Cu trench elements 210, 242, 244) may be formed from other metal(s), for example Iridium (Ir), Rhodium (Rh), Ruthenium (Ru), or Cobalt (Co). The various barrier layers, e.g., displacement-plated barrier regions 216, the optional dielectric barrier layer 234, and/or dielectric barrier layer 246 may be adjusted accordingly, i.e. the constituent elements thereof, based on the selected interconnect metal.

Figure 3A:
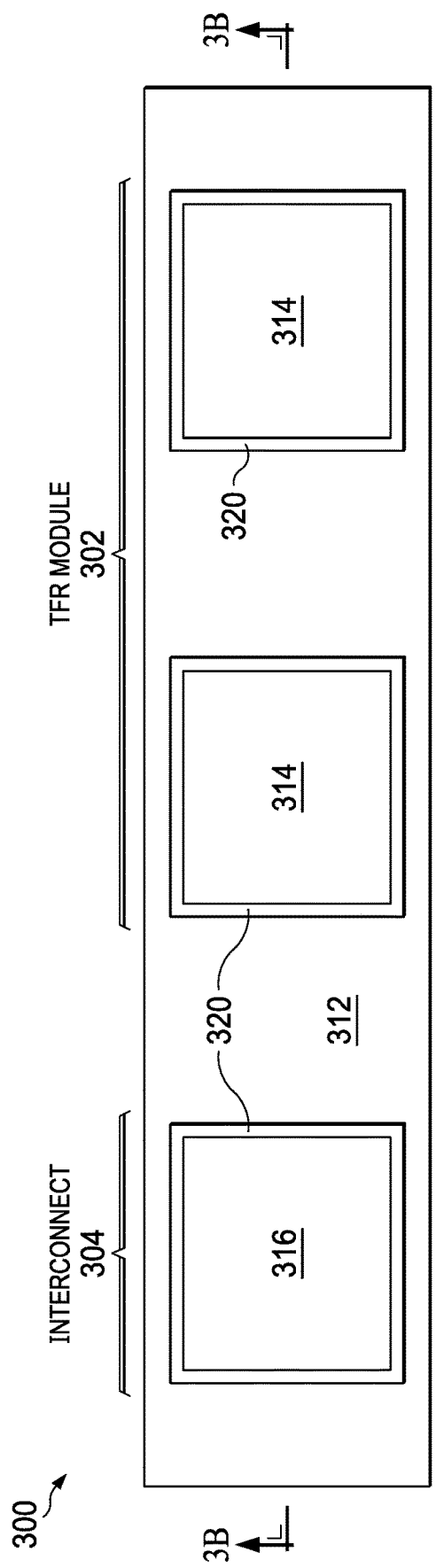
Figure 7A:
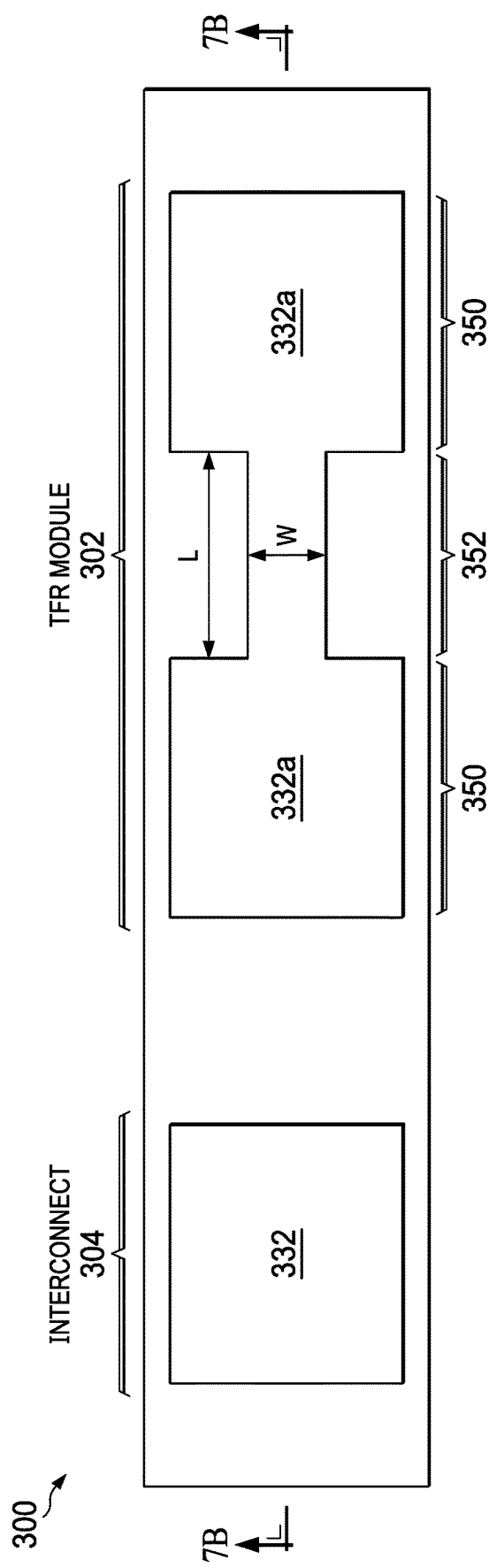
Figure 7B:
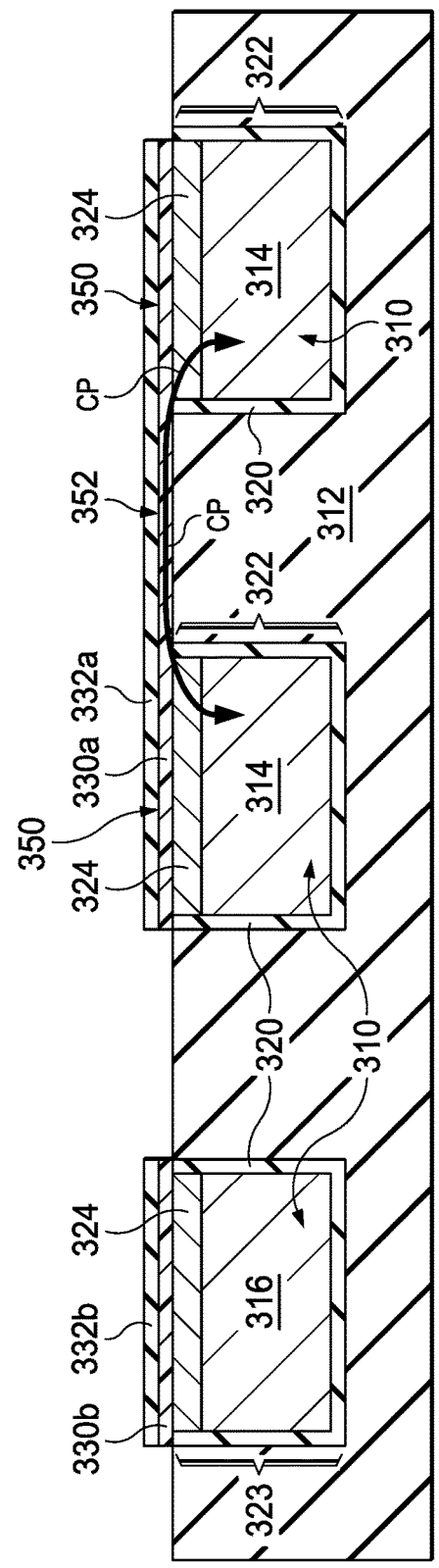
Figure 8:
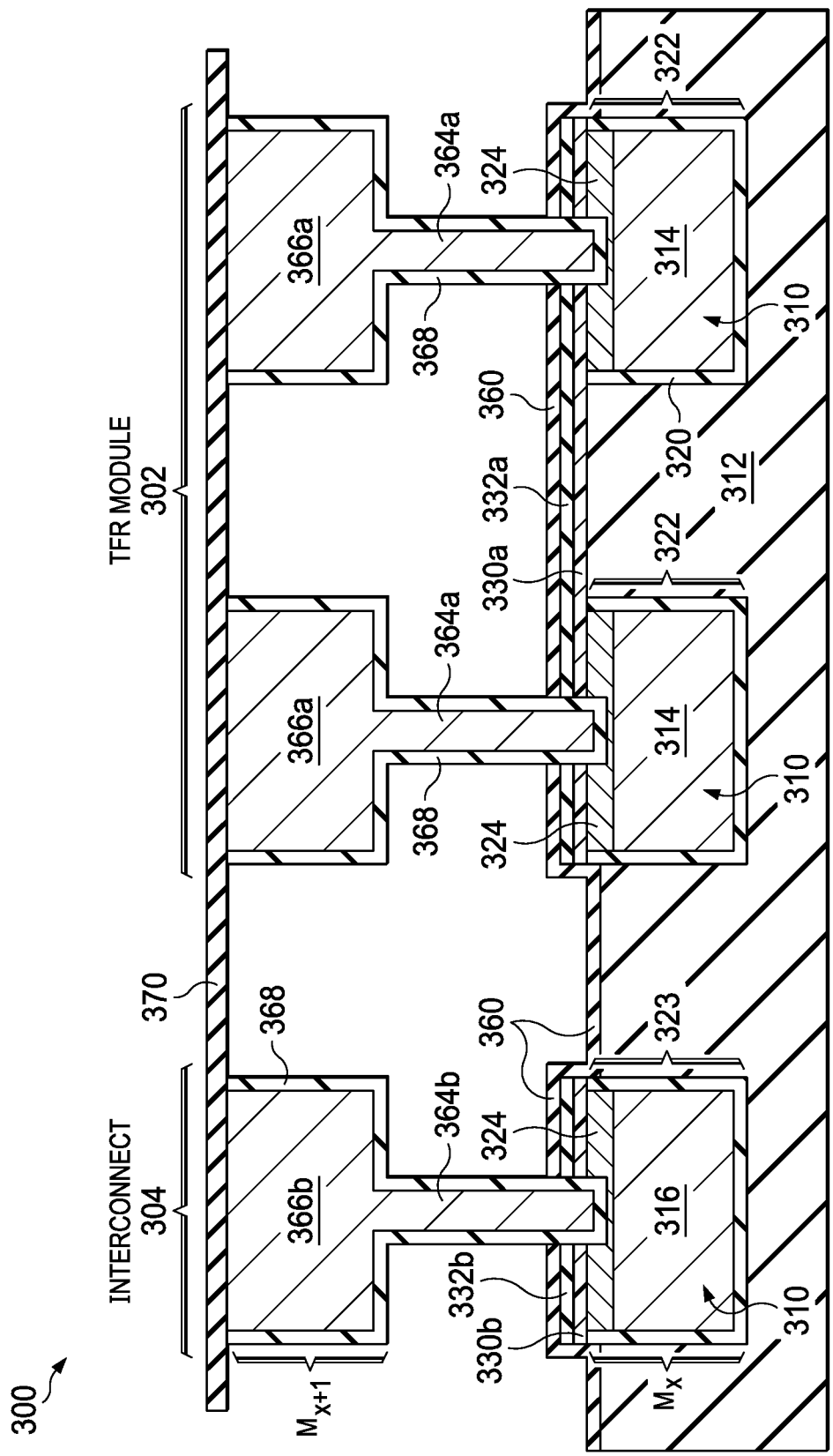

FIGS. 3A-8 show an example process for forming a TFR module 302 along with a nearby interconnect structure 304 in an example IC structure 300, according to one embodiment of the present disclosure. TFR module 302 and interconnect structure 304 formed according to the process shown in FIGS. 3A-8 may correspond with TFR module 202 and interconnect structure 204 shown in FIG. 2. Each pair of figures sharing the same figure number, namely FIGS. 3A and 3B, FIGS. 4A and 4B, FIGS. 5A and 5B, FIGS. 6A and 6B, and FIGS. 7A and 7B, shows a similar top view and a cross-sectional side view, respectively, of the example IC structure 300 being constructed, in which the cross-sectional side view is taken through a cut line indicated in the top view. For example, FIG. 3B shows a cross-sectional side view taken through line 3B-3B shown in the top view FIG. 3A, FIG. 4B shows a cross-sectional side view taken through line 4B-4B shown in the top view FIG. 4A, etc. FIG. 8 shows a cross-sectional side view of the completed TFR module 302 and interconnect 304.

Figure 3B:
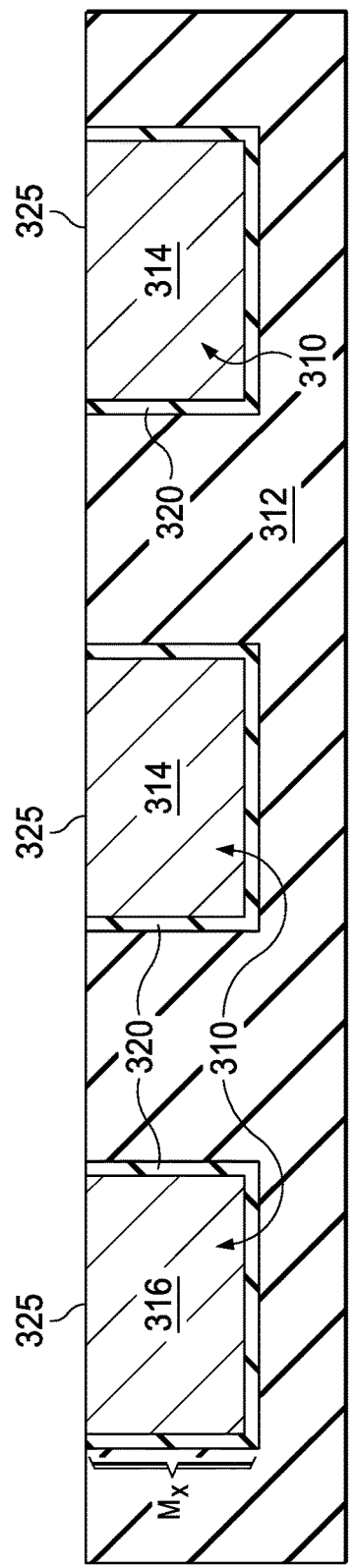

First, as shown in FIGS. 3A and 3B, the IC structure 300 may include Cu trench elements 310 formed in metal layer $M_x$ in a dielectric region 312. Cu trench elements 310 may define (a) a pair of Cu TFR head elements 314 for the TFR module 302 being constructed and (b) a Cu interconnect element 316 for the interconnect structure 304. Each Cu trench element 310 may be formed over a barrier layer 320 (e.g., a Ta/TaN bilayer) deposited in a respective trench opening. In one embodiment, the Cu trench elements 310 may be formed by a Cu damascene process in which Cu is deposited over dielectric region 312 and extends down into trench openings formed in dielectric region 312, followed by a chemical mechanical planarization (CMP) process to remove unwanted Cu at the top of the structure. Dielectric region 312 may include one or more dielectric materials, e.g., at least one silicon oxide, fluorosilicate glass (FSG), organosilicate glass (OSG), or porous low-k dielectric material.

After the CMP process, the exposed top surface 325 of each Cu trench element 310 is typically susceptible to oxidation, for example from the oxygen in the air, moisture in the air, or water residue left from a post CMP clean. Such corrosion can result in yield loss and reliability failure of the resulting IC device. Exposure to light may further accelerate such oxidation or corrosion process. Thus, it may be beneficial to protect the upper surface of each Cu trench element 310 soon after the CMP to reduce this corrosion risk.

Figure 4A:
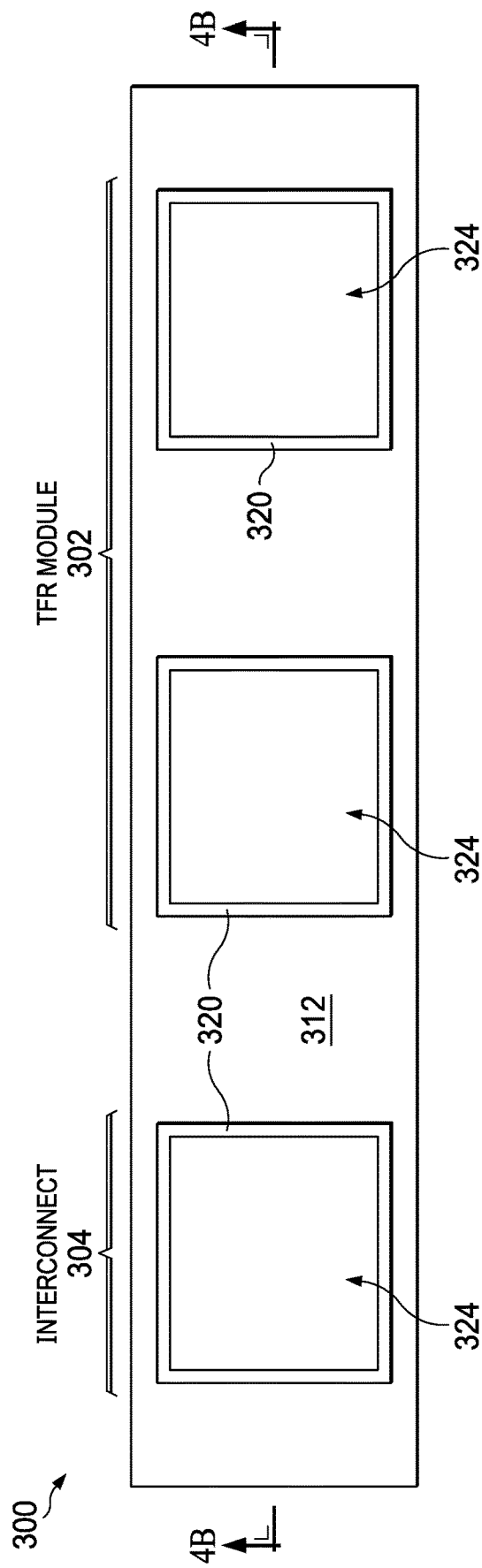
Figure 4B:
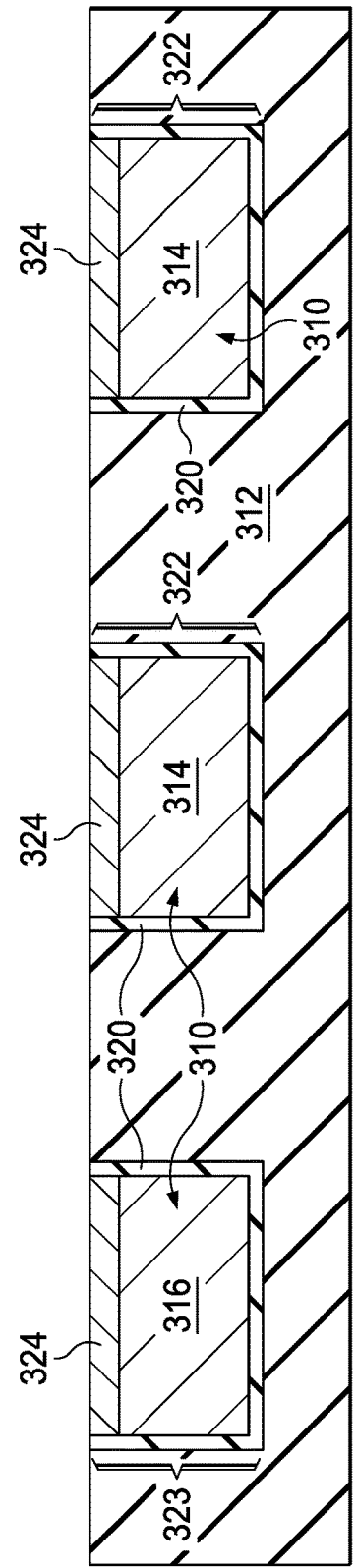

Thus, as shown in FIGS. 4A and 4B, a displacement plating (or displacement-plated barrier region) 324 is formed on the top surface of each Cu trench element 310, using an electroless plating (displacement-plating) process, to define displacement-plated TFR heads 322 and a displacement-plated interconnect element 323. The displacement-plated barrier region 324 formed at the top of each Cu trench element 310 may (a) protect the top surface 325 of the Cu trench element 310 from copper corrosion, e.g., during construction of the TFR module 302 and interconnect structure 304, and (b) reduce copper diffusion from the Cu trench element 310, e.g., into underlying or neighboring silicon, which may improve reliability performance. In addition, the displacement-plated barrier regions 324 formed on each Cu TFR head element 314 may provide an effective electrical contact between the respective Cu TFR head element 314 and an overlying TFR element 330a (discussed below). As mentioned above, displacement-plated barrier regions 324 may be formed from CoWP, CoWB, Pd, CoP, Ni, Co, Ni—Co alloy, or other suitable metal. In some embodiments, the displacement-plated barrier regions 324 may be formed with a thickness in the range of 100 Å-300 Å, for example about 200 Å.

Using a displacement plating process to form displacement-plated barrier regions 324 on each Cu trench element 310 allows for selective formation of a metal diffusion barrier on each Cu trench element 310, but not on the areas of dielectrics region 312 between the Cu trench element 310s. This may be advantageous over other techniques for forming a separate barrier region over Cu trench element 310, for example by depositing a barrier layer (e.g., Ta/TaN layer) over the full wafer and etching selected areas (e.g., between the various Cu trench elements) to avoid shorting the circuit, which may be significantly more costly than the displacement plating process.

Next, as shown in FIGS. 5A and 5B, a TFR film 330 is deposited over the structure, followed by a dielectric cap layer 332. The TFR film 330 may be formed directly onto the displacement-plated TFR heads 322 and displacement-plated interconnect element 323. TFR film 330 may include any suitable TFR film material, such as SiCCR, SiCr, NiCr, TaN, without limitation, and may be deposited by physical vapor deposition (PVD) or other suitable deposition technique. The dielectric cap layer 332 may be formed to protect the underlying TFR film 330 during construction of the TFR module 302. For example, in some embodiments the TFR film 330 may be very thin, e.g., a SiCCr film with a thickness of about 50 Å, and the performance of such thin film may be significantly affected by certain processes, e.g., an oxidation during an ash process (photoresist removal step). The dielectric cap layer 332 may be configured to protect the TFR film 330 from such processes. The dielectric cap layer 332 may comprise a silicon nitride, silicon oxide, or other suitable TFR cap material, and may be deposited by chemical vapor deposition (CVD) or other suitable deposition technique.

Next, as shown in FIGS. 6A and 6B, a photoresist mask (photomask) 340 is formed and patterned over the dielectric cap layer 332. The patterned photomask 340 may include (a) a TFR patterning region 342 including a respective head region 344 over each displacement-plated TFR head 322 and a connecting region 346 connecting the two head regions 344, which defines a dog-bone or bowtie shape for the TFR patterning region 342, and (b) an interconnect patterning region 348 covering the displacement-plated interconnect element 323. A length L and width W of the connecting region 346, which defines corresponding dimensions of the resulting post-etch TFR element as shown in FIGS. 7A-7B discussed below, may be selected or tuned to provide desired performance characteristics of the resulting TFR module 302.

In this embodiment, the patterned photomask 340 fully covers the patterned copper layer $M_x$, or in other words, the patterned photomask 340 covers the full area (from the top view shown in FIG. 6A) of all metal structures in layer $M_x$ on the wafer, including displacement-plated TFR head 322 and displacement-plated interconnect element 323. Patterning the photomask 340 to fully cover the metal layer $M_x$ may provide various advantages, as compared with patterning only an area associated with the TFR module 302. For example, in a photolithography process in which the TFR pattern density is low (e.g., about 1%), the required photo exposure is typically very high, which may cause the lens to overheat, leading to unwanted process variation. By patterning a much larger percentage of the wafer area (i.e., to cover the full $M_x$ layer), the required photo exposure may be substantially reduced, thus avoid potential lens overheating.

In addition, patterning the larger percentage of the wafer area may substantially reduce the subsequent plasma etch burden (by reducing the area to etch). In addition, the risk of plasma etch penetrating through the displacement-plated barrier regions 324 at the top of each Cu trench may be reduced or eliminated. Moreover, by pattering the full copper layer $M_x$, the photomask may be generated in a straightforward manner, e.g., by first reverse tuning the mask used to form the Cu trench layer $M_x$, then performing a logic "OR" of the reverse tuned mask with the TFR module pattern (e.g., to form the dog-bone or bowtie shape).

Next, as shown in FIGS. 7A and 7B, an etch may be performed to remove portions of the dielectric cap layer 332 and underlying TFR film 330 in areas unprotected by the patterned photomask 340. In some embodiments, a plasma etch, or alternatively a wet etch, may be performed. A resist strip and clean process may be performed after the etch. The resulting portions of the dielectric cap layer 332 and TFR film 330 may define (a) a TFR element 330a and corresponding TFR dielectric cap 332a over the displacement-plated TFR heads 322 and (b) an TFR film cap 330b and dielectric cap 332b over the displacement-plated interconnect element 323. The TFR element 330a includes (a) a head region 350 covering the full area of each displacement-plated TFR head 322 (corresponding with head regions 344 of patterned photomask 340 discussed above), and (b) a connecting region 352 that connects the two head regions 350 (corresponding with the connecting region 346 of patterned photomask 340 discussed above). As noted above, the length L and width W of the connecting region 352 may be selected or tuned by controlling the length L and width W of the connecting region 346 to provide desired performance characteristics of the resulting TFR module 302.

TFR element 330a formed on the pair of displacement-plated TFR heads 322 as disclosed above thereby defines a conductive path, indicated by double-headed arrow CP, between the two Cu TFR head elements 314 through the TFR element 330a and through the displacement-plated barrier regions 324.

Next, as shown in the cross-sectional side view of FIG. 8, an optional additional dielectric barrier layer 360 may be deposited over the structure. The optional additional dielectric barrier layer 360 may be silicon nitride (SiN) or silicon carbide (SiC), without limitation. After depositing the optional dielectric barrier layer 360, interconnect formation may continue, to thereby contact the displacement-plated TFR heads 322 and displacement-plated interconnect element 323. For example, each Cu trench element 310 may be contacted by a respective interconnect via 364a, 364b connected to a respective Cu trench element 366a, 366b formed in a metal layer $M_{x+1}$. In particular, each Cu TFR head element 314 may be contacted by a respective TFR contact via 364a and TFR contact 366a, and Cu interconnect element 316 may be contacted by an interconnect via 364b.

In the illustrated embodiment, Cu trench elements 366a, 366b and interconnect vias 364a, 364b comprise dual damascene Cu structures, e.g., formed by depositing a barrier layer 368 (e.g., a Ta/TaN bilayer), copper seed, and followed by copper plating, in respective dual damascene trenches and vias. Finally, a dielectric barrier layer 370, e.g., comprising silicon nitride (SiN) or silicon carbide (SiC), without limitation, may be formed over metal layer $M_{x+1}$.

In some embodiments, each interconnect via 364a, 364b (including barrier layer 368), which as indicated may be formed of Cu, may extend down to the displacement-plated barrier region 324 on each respective Cu trench element 310, such that the displacement-plated barrier region 324 on each Cu trench element 310 provides a conductive coupling between the respective Cu via 364a, 364b and Cu trench element 310. In other embodiments, each Cu via 364 extends further down, into the respective Cu trench element 310, to provide a direct conductive coupling between the Cu via 364 and Cu trench element 310.

In some embodiments, TFR element 330a may comprise SiCCR, SiCr, or NiCr with a thickness in the range of 50 Å-1000 Å, which may provide a sheet resistance $R_s$ in the range of 100 Ω/square to 10 kΩ/square, or about 1 kΩ/square, and a temperature coefficient of resistance (TCR) close to 0, for example in the range of −100 ppm/° C. to +100 ppm/° C.

FIGS. 9A-9B and 10A-10B show an alternative embodiment in which the patterned photomask used to form the TFR element covers only a selected area over the TFR heads, rather than covering the full metal layer $M_x$ as shown in FIGS. 6A-6B and discussed above. First, FIGS. 9A and 9B show top view and a cross-sectional side view, of an example TFR module 902 and interconnect structure 904 being constructed in an example IC structure 900. The IC structure 900 may include Cu trench elements 910 formed in metal layer $M_x$ in a dielectric region 912. Cu trench elements 910 define (a) a pair of Cu TFR heads 914 for the TFR module 902 being constructed and (b) a Cu interconnect structure 916. A displacement-plated barrier region 924, e.g., comprising CoWP, Pd, CoP, CoWB, Ni, Co, Ni—Co alloy, or other suitable material, is formed on an upper region of each Cu trench element 910, using known displacement plating techniques, to thereby define a pair of displacement-plated TFR heads 922 and a displacement-plated interconnect element 923. A TFR film 930, followed by a dielectric cap layer 932, are deposited over the structure. A photomask 910 is then formed and patterned over the dielectric cap layer 932.

Thus, the state of IC structure 900 shown in FIGS. 9A and 9B corresponds with the state of IC structure 300 shown in FIGS. 6A and 6B. However, unlike the patterned photomask 340 shown in FIGS. 6A and 6B that covers the full area of the displacement-plated TFR heads 322 and displacement-plated interconnect element 323, the patterned photomask 940 shown in FIGS. 9A and 9B covers only partial area of the displacement-plated e-fuse heads 922, and does not cover the displacement-plated interconnect element 923.

FIGS. 10A-10B show a result of an etch (e.g., plasma etch or wet etch) using the patterned photomask 940 shown in FIGS. 9A and 9B. As shown, the etch forms a TFR element 930a and overlying TFR dielectric cap 932a that bridges the pair of displacement-plated TFR heads 922. The etch may expose areas of displacement-plated barrier regions 924 and/or the copper of underlying Cu trench elements 910 (e.g., depending on the depth of the etch) in areas outside the photomask 940. In some instances the etch may expose areas of the underlying Cu trench elements 910, e.g., due to inherent variations in the etch process and the small thickness of the displacement-plated barrier regions (e.g., about 100 Å), which may present a significant reliability risk for the resulting IC devices. Thus, in some embodiments, an additional dielectric barrier layer may be deposited over the structure, e.g., to provide protection against copper diffusion.

The invention claimed is:

1. An integrated circuit (IC) structure, comprising:
 a thin film resistor (TFR) module, comprising:

a pair of spaced-apart displacement-plated TFR heads, comprising:
    a pair of TFR head elements spaced apart from each other in a dielectric region; and
    a displacement-plated barrier region at a top of each of the pair of TFR head elements;
a TFR element formed on the pair of spaced-apart displacement-plated TFR heads to define a conductive path between the pair of TFR head elements through the TFR element and through the displacement-plated barrier region at the top of each metal TFR head;
a TFR dielectric cap formed on the TFR element, the TFR dielectric cap having an etched perimeter corresponding with an etched perimeter of the underlying TFR element; and
conductive contacts coupled to the pair of spaced-apart displacement-plated TFR heads.

2. The IC structure of claim 1, wherein the TFR element comprises SiCr or SiCCr.

3. The IC structure of claim 1, wherein the pair of TFR head elements comprise copper damascene structures.

4. The IC structure of claim 1, wherein the displacement-plated barrier region at the top of each of the pair of TFR head elements comprises cobalt tungsten phosphide (CoWP).

5. The IC structure of claim 1 wherein the TFR element fully covers a top area of each of the pair of spaced-apart displacement-plated TFR heads.

6. The IC structure of claim 1, wherein the TFR film includes (a) a pair of head regions, each covering a top area of one of the displacement-plated TFR heads and (b) a connecting region connecting the pair of head regions, the connecting region having a smaller width than the head regions.

7. The IC structure of claim 1, wherein the TFR element has a thickness in the range of 50-1000 Angstroms.

8. The IC structure of claim 1, wherein the TFR dielectric cap comprises silicon nitride or silicon oxide.

9. An integrated circuit (IC) structure, comprising:
a thin film resistor (TFR) module comprising:
    a pair of spaced-apart displacement-plated TFR heads, comprising:
        a pair of TFR head elements formed in a first metal layer; and
        a pair of first displacement-plated barrier regions formed on the pair of TFR head elements, respectively; and
    a TFR element formed on the pair of spaced-apart displacement-plated TFR heads to define a conductive path connecting the pair of TFR head elements through the TFR element and through the displacement-plated barrier region formed on each TFR head element;
    a TFR dielectric cap formed on the TFR element, the TFR dielectric cap having an etched perimeter corresponding with an etched perimeter of the underlying TFR element; and
a first interconnect structure comprising:
    an interconnect element formed in the first metal layer; and
    a second displacement-plated barrier region formed on the interconnect element;
    a TFR layer region on the second displacement-plated barrier region, the TFR layer region and the TFR element comprising respective portions of a TFR layer;
    a dielectric cap on the TFR layer region, the dielectric cap having an etched perimeter corresponding with an etched perimeter of the TFR layer region, the dielectric cap and the TFR dielectric cap comprising respective portions of a dielectric cap layer.

10. The IC structure of claim 9, wherein the TFR element comprises SiCr or SiCCr.

11. The IC structure of claim 9, wherein the pair of TFR head elements and the interconnect element comprise copper damascene structures.

12. The IC structure of claim 9, wherein the pair of first displacement-plated barrier regions and the second displacement-plated barrier region comprise cobalt tungsten phosphide (CoWP).

13. The IC structure of claim 9, wherein the TFR film includes (a) a pair of head regions, each covering a top area of one of the displacement-plated TFR heads and (b) a connecting region connecting the pair of head regions, the connecting region having a smaller width than the head regions.

14. The IC structure of claim 9, further comprising a second metal layer comprising:
    a respective TFR contact connected to each displacement-plated TFR head by a respective TFR contact via; and
    an upper interconnect structure connected to the first interconnect structure by an interconnect via.

15. The IC structure of claim 9, wherein the dielectric cap layer comprises silicon nitride or silicon oxide.

* * * * *